United States Patent
Fink et al.

(10) Patent No.: US 7,241,397 B2
(45) Date of Patent: Jul. 10, 2007

(54) HONEYCOMB OPTICAL WINDOW DEPOSITION SHIELD AND METHOD FOR A PLASMA PROCESSING SYSTEM

(75) Inventors: Steven T. Fink, Mesa, AZ (US); Andrej S. Mitrovic, Phoenix, AZ (US); Paula A. Calabrese, Phoenix, AZ (US)

(73) Assignee: Tokyo Electron Limited, Tokyo (JP)

( * ) Notice: Subject to any disclaimer, the term of this patent is extended or adjusted under 35 U.S.C. 154(b) by 443 days.

(21) Appl. No.: 10/811,912

(22) Filed: Mar. 30, 2004

(65) Prior Publication Data

US 2005/0225248 A1    Oct. 13, 2005

(51) Int. Cl.
*C23C 16/00* (2006.01)
*C23C 14/34* (2006.01)
*G01L 21/30* (2006.01)

(52) U.S. Cl. .................. 216/67; 216/59; 216/60; 204/192.32; 204/192.33; 204/298.11; 204/298.31; 204/298.32; 156/345.24; 156/345.25; 118/715; 118/723 E; 118/712; 118/713

(58) Field of Classification Search .......... 204/192.32, 204/192.33, 298.11, 298.31, 298.32; 156/345.24, 156/345.25; 118/715, 723 E, 712, 713; 216/59, 216/60, 67; 427/8, 10
See application file for complete search history.

(56) References Cited

U.S. PATENT DOCUMENTS 6,562,186 B1 * 5/2003 Saito et al. ............ 156/345.24

6,798,519 B2 * 9/2004 Nishimoto et al. ......... 356/419

FOREIGN PATENT DOCUMENTS

JP     2000-077395     * 3/2000

OTHER PUBLICATIONS

The Random House College Dictionary, p. 635, 1982.*

* cited by examiner

*Primary Examiner*—Rodney G. McDonald
(74) *Attorney, Agent, or Firm*—Oblon, Spivak, McClelland, Maier & Neustadt, P.C.

(57) ABSTRACT

An optical window deposition shield including a backing plate having a through hole, and a honeycomb structure having a plurality of adjacent cells configured to allow optical viewing through the honeycomb structure. Each cell of the honeycomb structure has an aspect ratio of length to diameter sufficient to impede a processing plasma from traveling through the full length of the cell. A coupling device configured to couple the honeycomb core structure to the backing plate such that the honeycomb structure is aligned with at least a portion of the through hole in the backing plate. The optical window deposition shield shields the optical viewing window of a plasma processing apparatus from contact with the plasma.

47 Claims, 9 Drawing Sheets

HONEYCOMB OPTICAL WINDOW DEPOSITION SHIELD AND METHOD FOR A PLASMA PROCESSING SYSTEM

BACKGROUND OF THE INVENTION

1. Field of the Invention

The present invention relates to an improved component for a plasma processing system and, more particularly, to an optical window deposition shield employed in a plasma processing system to provide optical access to a process space through the deposition shield.

2. Discussion of the Background

The fabrication of integrated circuits (IC) in the semiconductor industry typically employs plasma to create and assist surface chemistry within a plasma reactor necessary to remove material from and deposit material to a substrate. In general, plasma is formed with the plasma reactor under vacuum conditions by heating electrons to energies sufficient to sustain ionizing collisions with a supplied process gas. Moreover, the heated electrons can have energy sufficient to sustain dissociative collisions and, therefore, a specific set of gasses under predetermined conditions (e.g. chamber pressure, gas flow rate etc.) are chosen to produce a population of charged species and chemically reactive species suitable to the particular process being performed within the chamber (e.g. etching processes where materials are removed from the substrate or deposition where materials are added to the substrate).

Although the formation of a population of charged species (ions, etc.) and chemically reactive species is necessary for performing the function of the plasma processing system (i.e. material etch, material deposition, etc.) at the substrate surface, other component surfaces on the interior of the plasma processing chamber are exposed to the physically and chemically active plasma and, in time, can erode or become coated with deposits. The erosion or coating of exposed components in the plasma processing system can lead to a gradual degradation of the plasma processing performance and ultimately to complete failure of the system.

Figure 6:
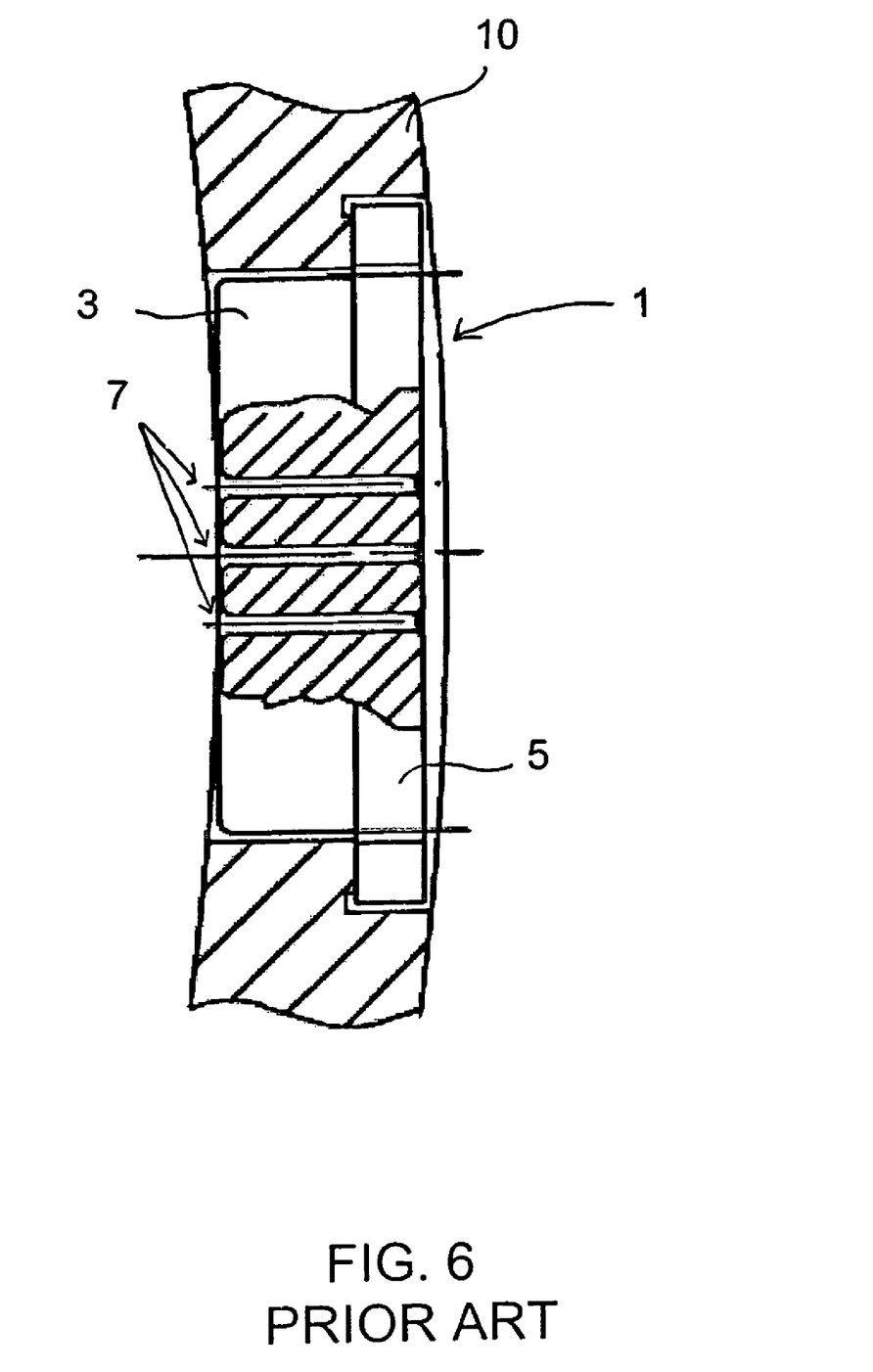
FIG. 6 shows an enlarged cross-sectional view of a conventional optical window deposition shield in relation to a chamber wall deposition shield.

Thus, in order to minimize the damage of components of a plasma processing system, more particularly optical windows, an optical window deposition shield is mounted between the optical window and the plasma. FIG. 6 is a partial cross-sectional view of a conventional optical window deposition shield in relation to a chamber wall deposition shield. As seen in this figure, the optical window deposition shield 1 includes a main body 3 and a peripheral flange 5 used to connect the optical window deposition shield 1 with a chamber wall shield 10. As seen in the partial cross-section portion of the optical window deposition shield 1 itself, the optical window deposition shield 1, typically fabricated from aluminum, includes many high aspect ratio holes 7 that open to the plasma. The high aspect ratio holes 7 have a ratio of length to diameter of four or greater. While these high aspect ratio holes 7 allow viewing through the optical window deposition shield 1, because of their geometry, the high aspect ratio holes 7 do not allow plasma to form close to the optical window of a plasma chamber that the shield is used in. Further, the optical window deposition shield 1 can be coated with various protective materials. For example, the optical window deposition shield 1 can be anodized to produce a surface layer of aluminum oxide, which is more resistant to the plasma.

Details of an optical window deposition shield in relation to a plasma processing chamber will be discussed with respect to FIG. 1 below.

While effective in shielding the optical window of a processing chamber, prior art optical window deposition shields such as the one shown in FIG. 6 pose problems. First, the process of forming multiple holes in a block of aluminum does not provide a large ratio of viewing area (i.e., holes) to metal region, thereby making viewing of the plasma properties through the shield 1 difficult.

Moreover, the prior art optical viewing window shields are expensive to manufacture and are typically machined to a specific shape corresponding to the chamber liner configuration. Therefore, periodic maintenance, such as removal of the optical window deposition shield 1 for cleaning and inspection, is performed to prolong the life of the shield. Because the optical window deposition shield 1 is an integral structure fastened to the chamber liner 10, removal is complicated and time consuming, which results in further expense in the way of labor and chamber downtime. Finally, the optical window deposition shield 1 is heavy and bulky making safe disposal difficult.

As an alternative to the optical window deposition shield, the damage of the optical window can be minimized by providing gas flow over the optical window to keep it free of plasma contact during plasma processing. However, the necessary gas flow device is expensive and cannot easily be retrofitted to an existing chamber.

SUMMARY OF THE INVENTION

One object of the present invention is to address the above described and/or other problems in the art of plasma processing system.

Another object of the present invention is to provide an optical window deposition shield that is disposable.

Still another object of the present invention is to provide an optical window deposition shield that minimizes the frequency of maintenance of an optical window and replacement of new optical window.

These and/or other objects of the invention are provided by an optical window deposition shield including a backing plate having a through hole, and a honeycomb structure having a plurality of adjacent cells configured to allow optical viewing through the honeycomb structure. Each cell of the honeycomb structure has an aspect ratio of length to diameter sufficient to impede a processing plasma from traveling through the full length of the cell. A coupling device configured to couple the honeycomb core structure to the backing plate such that the honeycomb structure is aligned with at least a portion of the through hole in the backing plate.

In another aspect of the invention, an optical window deposition shield includes a honeycomb structure planar sheet having a plurality of adjacent cells configured to allow optical viewing through the honeycomb structure. Each cell of the honeycomb structure has an aspect ratio of length to diameter sufficient to impede a processing plasma from traveling through the full length of the cell. Also included is a clip device configured to hold opposing ends of the honeycomb planar sheet together to form a substantially continuous liner of honeycomb material configured to line the chamber wall of a plasma processing chamber.

In yet another aspect of the invention, a plasma processing chamber includes a chamber wall having an optical viewing window, a chamber liner having a hole that is substantially aligned with the viewing window to permit viewing an interior of the chamber through the viewing window and hole, and an optical window deposition shield substantially aligned with the viewing window and liner hole. The optical viewing window deposition shield includes a backing plate having a through hole, and a honeycomb structure having a plurality of adjacent cells configured to allow optical viewing through the honeycomb structure. Each cell of the honeycomb structure has an aspect ratio of length to diameter sufficient to impede a processing plasma from traveling through the full length of the cell. A coupling device configured to couple the honeycomb core structure to the backing plate such that the honeycomb structure is aligned with at least a portion of the through hole in the backing plate.

Still another aspect includes an optical window deposition shield having means for impeding processing plasma from traveling into contact with a viewing window of a plasma chamber, and means for holding the means for impeding within an opening of a chamber liner used in the plasma chamber.

Another aspect of the invention includes a method for impeding a processing plasma from traveling into contact with a viewing window of a plasma chamber. The method includes providing a mounting hole in a liner of the plasma chamber, and fixedly mounting a honeycomb structure within the mounting hole, the honeycomb structure having a plurality of adjacent cells configured to allow optical viewing through the honeycomb structure, each cell having an aspect ratio of length to diameter sufficient to impede a processing plasma from traveling through the full length of the cell.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, where.

DESCRIPTION OF THE PREFERRED EMBODIMENTS

Referring now to the drawings, wherein like reference numerals designate identical or corresponding parts throughout the several views. FIG. 1 shows a simplified block diagram of a plasma processing system according to an embodiment of the present invention. As seen in this figure, a plasma processing system 100 includes a plasma processing chamber 10, an upper assembly 20, an electrode plate 24, a substrate holder 30 for supporting a substrate 35, and a pumping duct 40 coupled to a vacuum pump (not shown) for providing a reduced pressure atmosphere 11 in plasma processing chamber 10. Plasma processing chamber 10 can facilitate the formation of processing plasma in a process space 12 adjacent substrate 35. The plasma processing system 100 can be configured to process 200 mm substrates, 300 mm substrates, or larger.

In the illustrated embodiment, the upper assembly 20 can include at least one of a cover, a gas injection assembly, and an upper electrode impedance match network. For example, the electrode plate 24 can be coupled to an RF source. In another alternate embodiment, the upper assembly 20 includes a cover and an electrode plate 24, wherein the electrode plate 24 is maintained at an electrical potential equivalent to that of the plasma processing chamber 10. For example, the plasma processing chamber 10, the upper assembly 20, and the electrode plate 24 can be electrically connected to ground potential.

Plasma processing chamber 10 can, for example, further include a deposition shield 14 for protecting the plasma processing chamber 10 from the processing plasma in the process space 12, and an optical viewport 16. Optical viewport 16 can include an optical window 17 coupled to the backside of an optical window deposition shield 18, and an optical window clamp 19 can be configured to couple optical window 17 to the optical window deposition shield 18. Sealing members, such as O-rings (not shown), can be provided between the optical window clamp 19 and the optical window 17, between the optical window 17 and the optical window deposition shield 18, and between the optical window deposition shield 18 and the plasma processing chamber 10. Optical viewport 16 can, for example, permit monitoring of optical emission from the processing plasma in process space 12.

Substrate holder 30 can, for example, further include a vertical translational device 50 surrounded by a bellows 52 coupled to the substrate holder 30 and the plasma processing chamber 10, and configured to seal the vertical translational device 50 from the reduced pressure atmosphere 11 in plasma processing chamber 10. Additionally, a bellows shield 54 can, for example, be coupled to the substrate holder 30 and configured to protect the bellows 52 from the processing plasma. Substrate holder 30 can, for example, further be coupled to at least one of a focus ring 60, and a shield ring 62. Furthermore, a baffle plate 64 can extend about a periphery of the substrate holder 30.

Substrate 35 can be, for example, transferred into and out of plasma processing chamber 10 through a slot valve (not shown) and chamber feed-through (not shown) via robotic substrate transfer system where it is received by substrate lift pins (not shown) housed within substrate holder 30 and mechanically translated by devices housed therein. Once substrate 35 is received from substrate transfer system, it is lowered to an upper surface of substrate holder 30.

Substrate 35 can be, for example, affixed to the substrate holder 30 via an electrostatic clamping system. Furthermore, substrate holder 30 can, for example, further include a cooling system including a re-circulating coolant flow that receives heat from substrate holder 30 and transfers heat to a heat exchanger system (not shown), or when heating, transfers heat from the heat exchanger system. Moreover, gas can, for example, be delivered to the back-side of substrate 35 via a backside gas system to improve the gas-gap thermal conductance between substrate 35 and substrate holder 30. Such a system can be utilized when temperature control of the substrate is required at elevated or reduced temperatures. In other embodiments, heating elements, such as resistive heating elements, or thermo-electric heaters/coolers can be included.

Figure 1:
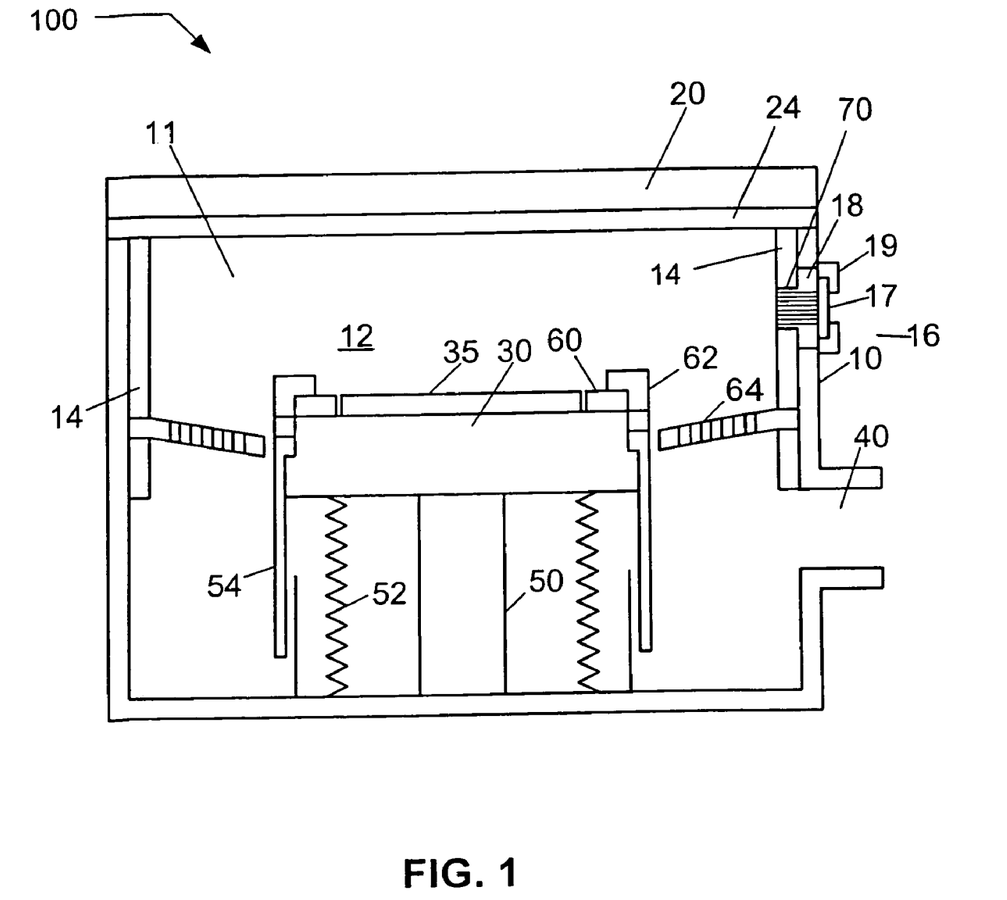
FIG. 1 shows a simplified block diagram of a plasma processing system according to an embodiment of the present invention.

In the illustrated embodiment, shown in FIG. 1, substrate holder 30 can include an electrode through which RF power is coupled to the processing plasma in process space 12. For example, substrate holder 30 can be electrically biased at a RF voltage via the transmission of RF power from a RF generator (not shown) through an impedance match network (not shown) to substrate holder 30. The RF bias can serve to heat electrons to form and maintain plasma. In this configuration, the system can operate as a reactive ion etch (RIE) reactor, wherein the chamber and upper gas injection electrode serve as ground surfaces. A typical frequency for the RF bias can range from 1 MHz to 100 MHz and is preferably 13.56 MHz. RF systems for plasma processing are well known to those skilled in the art.

Alternately, the processing plasma formed in process space 12 can be formed using a parallel-plate, capacitively coupled plasma (CCP) source, an inductively coupled plasma (ICP) source, any combination thereof, and with and without DC magnet systems. Alternately, the processing plasma in process space 12 can be formed using electron cyclotron resonance (ECR). In yet another embodiment, the processing plasma in process space 12 is formed from the launching of a Helicon wave. In yet another embodiment, the processing plasma in process space 12 is formed from a propagating surface wave.

Figure 2:
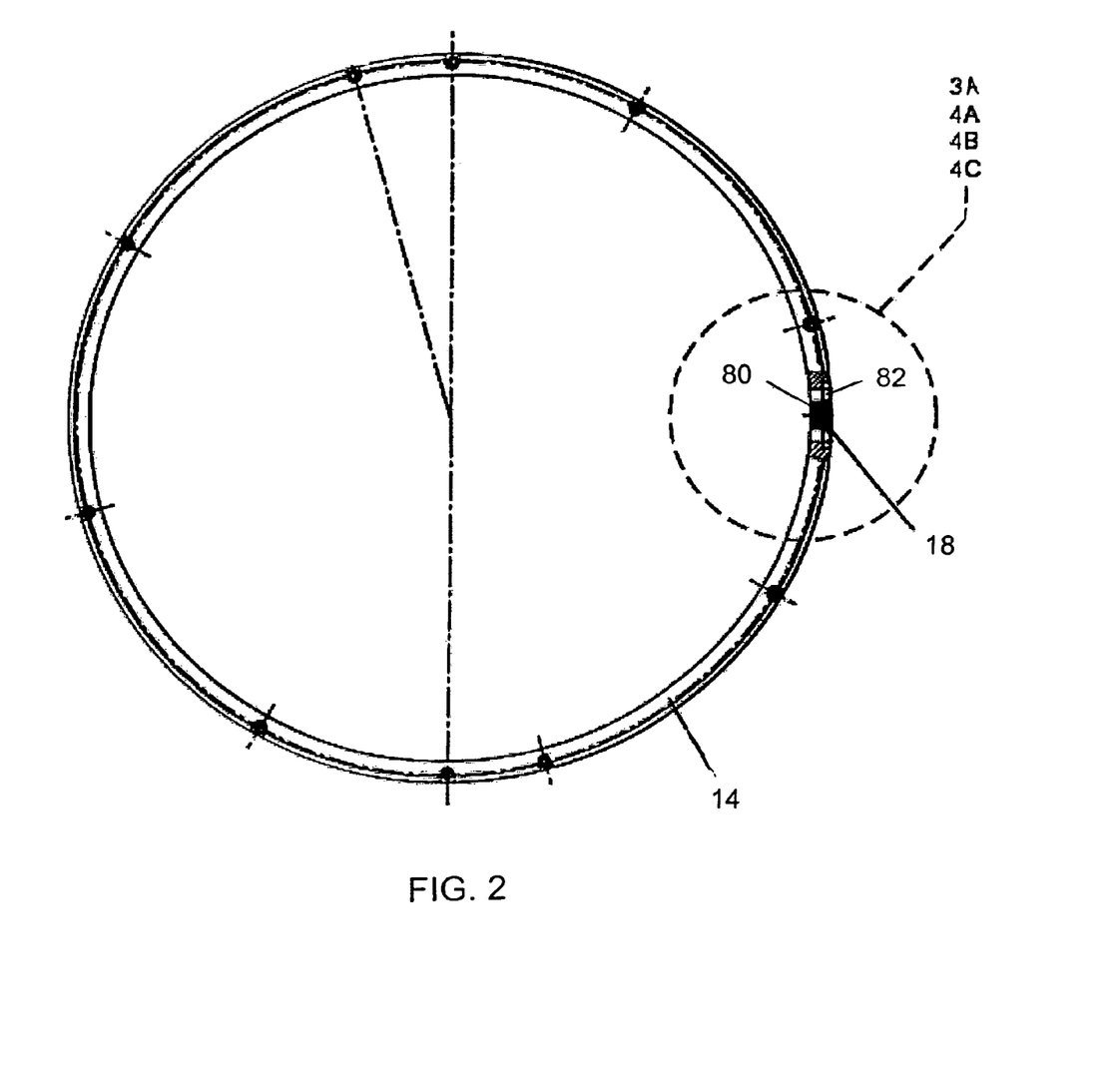
FIG. 2 shows a top view of a chamber liner having an optical window deposition shield according to an embodiment of the present invention.

FIG. 2 is an illustration of a chamber liner having an optical window deposition shield in accordance with one embodiment of the present invention. The chamber liner 14 may form a deposition shield for the entire portion of a plasma processing chamber such as that shown in FIG. 1. In FIG. 2, the optical window deposition shield 18 is shown by way of a partial cross-sectional view of the chamber liner 14. The optical window deposition shield 18 includes a honeycomb structure 80 that allows optical viewing of a plasma (not shown) on the interior of the chamber liner 14, while impeding the plasma contacting a chamber window (not shown) that is aligned with the optical window deposition shield 18 on the exterior of the chamber liner 14. The optical window deposition shield 18 also includes a backing plate 82 that couples the honeycomb structure 80 with the chamber liner 14. Details of alternative configurations of the optical window deposition shield 18 in relation to the chamber liner 14 are shown in FIGS. 3A, 4A, 4B and 4C.

Figures 3A, 3B:
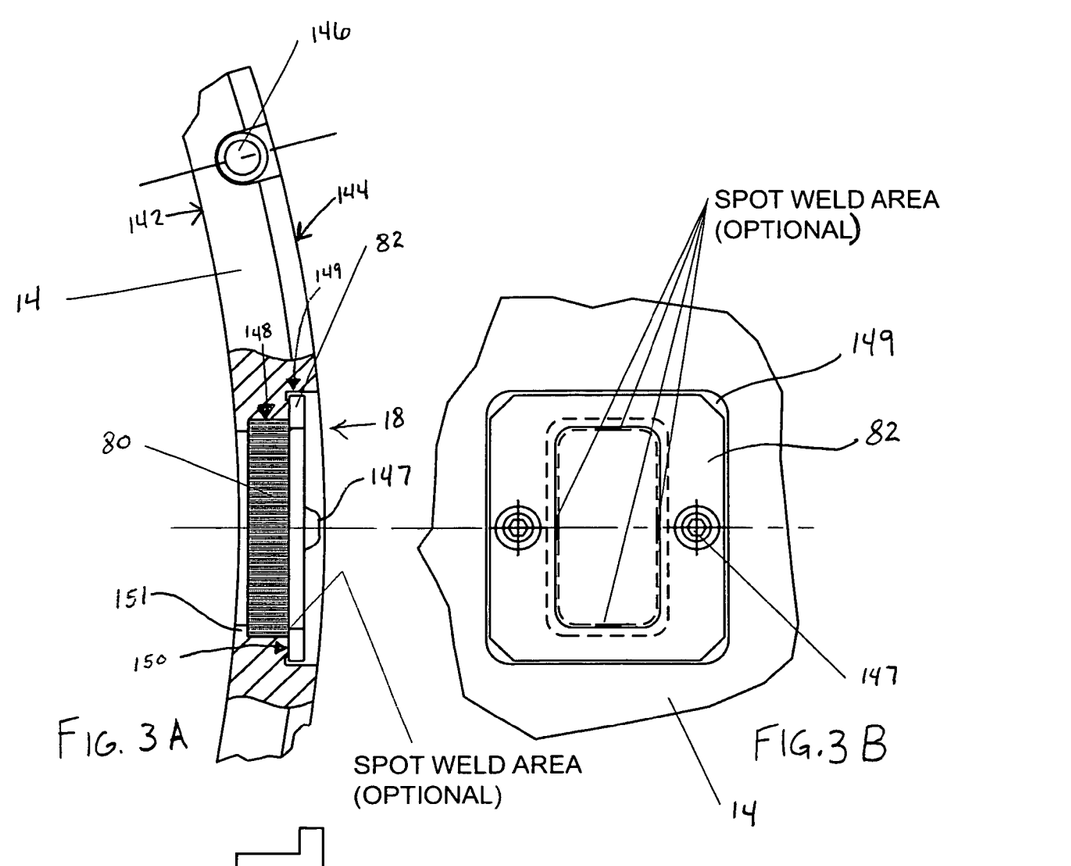
FIG. 3A shows an enlarged cross-sectional top view of a chamber liner having an optical window deposition shield according to an embodiment of the present invention.
FIG. 3B shows an orthogonal plan view of the optical window deposition shield of FIG. 3A.
Figure 3C:
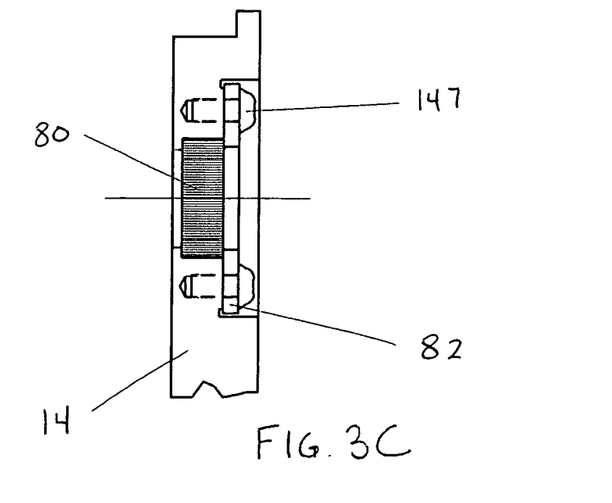
FIG. 3C shows an orthogonal side view of the optical window deposition shield of FIG. 3A.

FIG. 3A is an enlarged cross-sectional top view of a chamber liner having an optical window deposition shield in accordance with an embodiment of the present invention. FIG. 3B is an orthogonal plan view and FIG. 3C is an orthogonal side view of the optical window deposition shield shown in FIG. 3A. As seen in these figures, the chamber liner 14 includes an inner annular portion 142 and an outer annular portion 144. The chamber liner 14 is fastened to the upper assembly 20 and the electrode plate 24 by way of a connecting device 146.

As best seen in the cross-sectional portion of FIG. 3A, the chamber liner 14 also includes a through hole having a small opening 148 facing the interior of the chamber liner 14, and an enlarged opening 149 at the exterior of the chamber liner 14 so as to form a retaining surface or lip 150 in the chamber liner 14. As seen in FIG. 3A, the backing plate 82 of the optical window deposition shield 18 fits within the enlarged opening 149 in flush contact with the lip 150, while the honeycomb structure 80 fits within the smaller opening 148. In the embodiment of FIG. 3A, the small opening 148 includes a front portion 151 that engages the honeycomb structure 80 to prevent the honeycomb structure 80 from dropping into the process space 12 and to assist in maintaing the honeycomb structure 80 in a fixed position. Preferably, the honeycomb structure 80 snugly engages the sidewalls of the smaller opening 148 to be held in contact with the front portion 151. In this regard, the honeycomb structure 80 preferably has an expansion quality that allows it to be slightly compressed when placed within the smaller opening 148, and then expand to engage the sidewalls of the opening 148.

In the embodiment of FIG. 3A, the backing plate 82 engages the lip 150 to assist in substantially maintaining the honeycomb structure 80 in a fixed position within the chamber liner 14. In the embodiment of FIG. 3A, the backing plate 82 includes a fastening device 147 such as screws to fix the backing plate 82 to the chamber liner 14 so as to assist in maintaining the honeycomb structure 80 in a fixed position. However, other mechanisms for holding the backing plate within the large opening 149 may be used. For example, the periphery of the backing plate 82 and/or sidewall of the opening 149 may include an elastic material or device that deforms when the backing plate 82 is inserted into the opening 149, but maintains tension contact between the backing plate 82 and sidewall such that the backing plate is substantially held in a fixed position within the opening 149. The backing plate 82 may or may not be in contact with the lip 150, but should substantially contact the fixed backing plate to remain within the opening 148.

In the embodiment of FIG. 3A, coupling between the honeycomb structure 80 and the backing plate 82 is provided by mere contact held between these two objects due to their fixed positioning within the openings 148 and 149. Specifically, coupling between the honeycomb structure 80 and the backing plate 82 is provided by way of the front portion 151 and the side walls of the smaller opening 148 holding the honeycomb structure in place, while the backing plate 82 is held in contact with the honeycomb structure 80 by the fastening device 147 holding the backing plate against the honeycomb structure 80 and the lip 150. As would be understood by one of ordinary skill in the art, however, it is only necessary for the honeycomb structure 80 to be held within the small opening 148 by either the front portion, or snug engagement with the side walls of the opening 148, or any other known method for holding the honeycomb structure 80 within the opening 148. A backing plate may not be necessary where the honeycomb structure is configured to maintain a fixed position within the opening 148, such as with the honeycomb expansion feature described above, but the backing plate is preferred to ensure the structure 80 remains in a substantially fixed position.

Figure 3D:
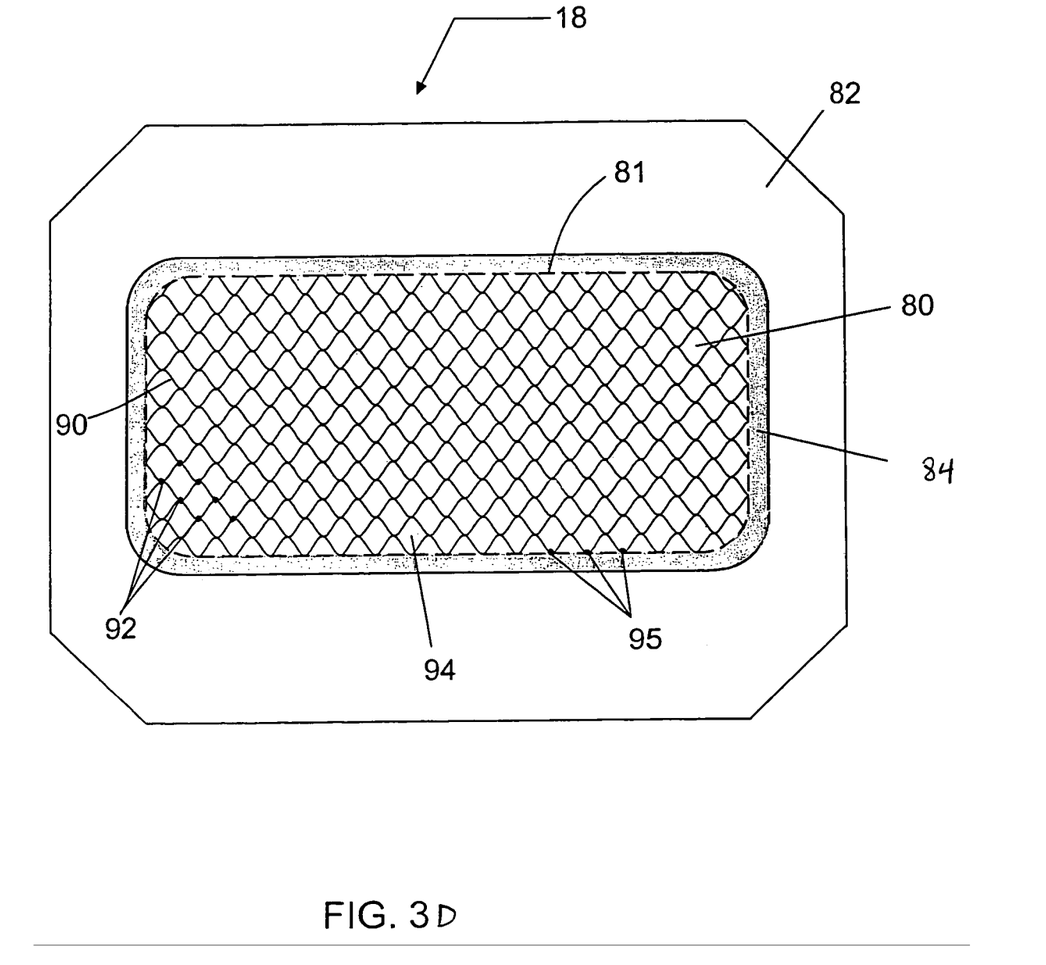
FIG. 3D shows a plan view of an optical window deposition shield according to an embodiment of the present invention.

FIG. 3D shows a plan view of the optical window deposition shield 18 with details of the honeycomb structure in accordance with an embodiment of the present invention. In the embodiment of FIG. 3D the backing plate 82 is substantially rectangular in shape and has a rounded edge rectangular opening 81 occupied by the honeycomb structure 80. The backing plate 82 is preferably made of aluminum sheet metal having an anodized coating thereon, however, other suitable materials may be used. As seen in FIG. 3D, a periphery portion 84 of the honeycomb core 80 is in planer contact with the backing plate 82. Thus, the periphery portion 84 of the honeycomb core 80 may conceal the edge of the opening 81, which is shown in phantom in the figure. In one embodiment of the invention, the opening 81 and the shape of the honeycomb core 80 both match the shape of the opening in the chamber liner 14. However, it is only necessary that the honeycomb core 80 substantially match the shape of the through hole in the chamber liner 14 so as to impede the plasma from reaching the chamber window when the optical window deposition shield 18 is installed in a plasma chamber.

In FIG. 3D, the honeycomb core 80 is made of a plurality of corrugated sheets of material 90 that are connected to each other at connection points 92 and connected to the backing plate 82 to form a plurality of cells 94. The connecting points 92 may be metal welds or adhesive connections. If adhesive connections are used, however, adhesive that does not break down when exposed to a plasma process is preferably selected to avoid particle contamination in the plasma chamber. As also seen in FIG. 3D, the honeycomb material 80 can optionally be welded to the backing plate 82 by welds 95. Each cell 94 may have a ratio length to diameter of four or greater. However, it is sufficient that each cell 94 has an aspect ratio sufficient to impede, and preferably substantially prevent, a plasma from traveling the longitudinal distance of the cell to a chamber window. The use of a plurality of adjacent cells allows viewing of the interior of the plasma chamber through the honeycomb core material 80. Many variations in the thickness of the sheet material 90 and the size and number of cells 94 are possible. In one embodiment of the invention, the honeycomb core structure 80 is formed of the sheet material 90 having a thickness of between 0.002 to 0.005 inches. Moreover, the honeycomb core structure 80, shown in FIG. 3D, is a schematic representation and, thus, not all connecting points are represented and the cell sizes vary widely.

The honeycomb core material 80 is preferably made of aluminum and may be coated with a protective coating. Alternatively, the honeycomb core material 80 can also be made of one of titanium alloys, aluminum alloys, nickel alloys, stainless alloys and carbon steel alloys. In one embodiment of the invention, the honeycomb core material 80 is made of 3003 Aluminum alloy or 5056 aluminum alloy. Also, a laser welded honeycomb core available from BENECOR, INC of Parson, Kans. can be used as the honeycomb core material 80. The protective coating can include a compound including an oxide of aluminum such as $Al_2O_3$. In another embodiment of the invention, the protective coating can include a mixture of $Al_2O_3$ and $Y_2O_3$. In still another embodiment of the invention, the protective coating can include at least one of a III-column element (i.e., column 3 of the Periodic Table) and a lanthanon element. In another embodiment of the invention, the III-column element can comprise at least one of yttrium, scandium, and lanthanum. In still another embodiment of the present invention, the lanthanon element can comprise at least one of cerium, dysprosium, and europium. In another embodiment of the invention, the compound forming the protective layer can include at least one of yttria ($Y_2O_3$), $Sc_2O_3$, $Sc_2F_3$, $YF_3$, $LA_2O_3$, $CeO_2$, $Eu_2O_3$, $DyO_3$.

The above-described structure of the optical window deposition shield 18 can provide several advantages over the prior art shields such as that shown in FIG. 6. First, the relatively thin walled cells 94 of the honeycomb core 80 provide a large ratio of viewing area to metal region, thereby facilitating viewing of the interior of a plasma chamber through the optical window deposition shield 18. Moreover, the honeycomb core structure 80 is inexpensive to manufacture and, therefore, can be periodically replaced rather than performing labor-intensive maintenance that causes machine downtime. In this regard, because the honeycomb core 80 is detachably coupled to the backing plate 82, the honeycomb core 80 can be easily and quickly removed and replaced, while the backing plate 82 is generally unexposed to plasma and can therefore be reused. Still further, the structure of the honeycomb core 80 allows it to be easily crushed (such as by hand) to a small volume for safe and easy disposal.

Figure 4A:
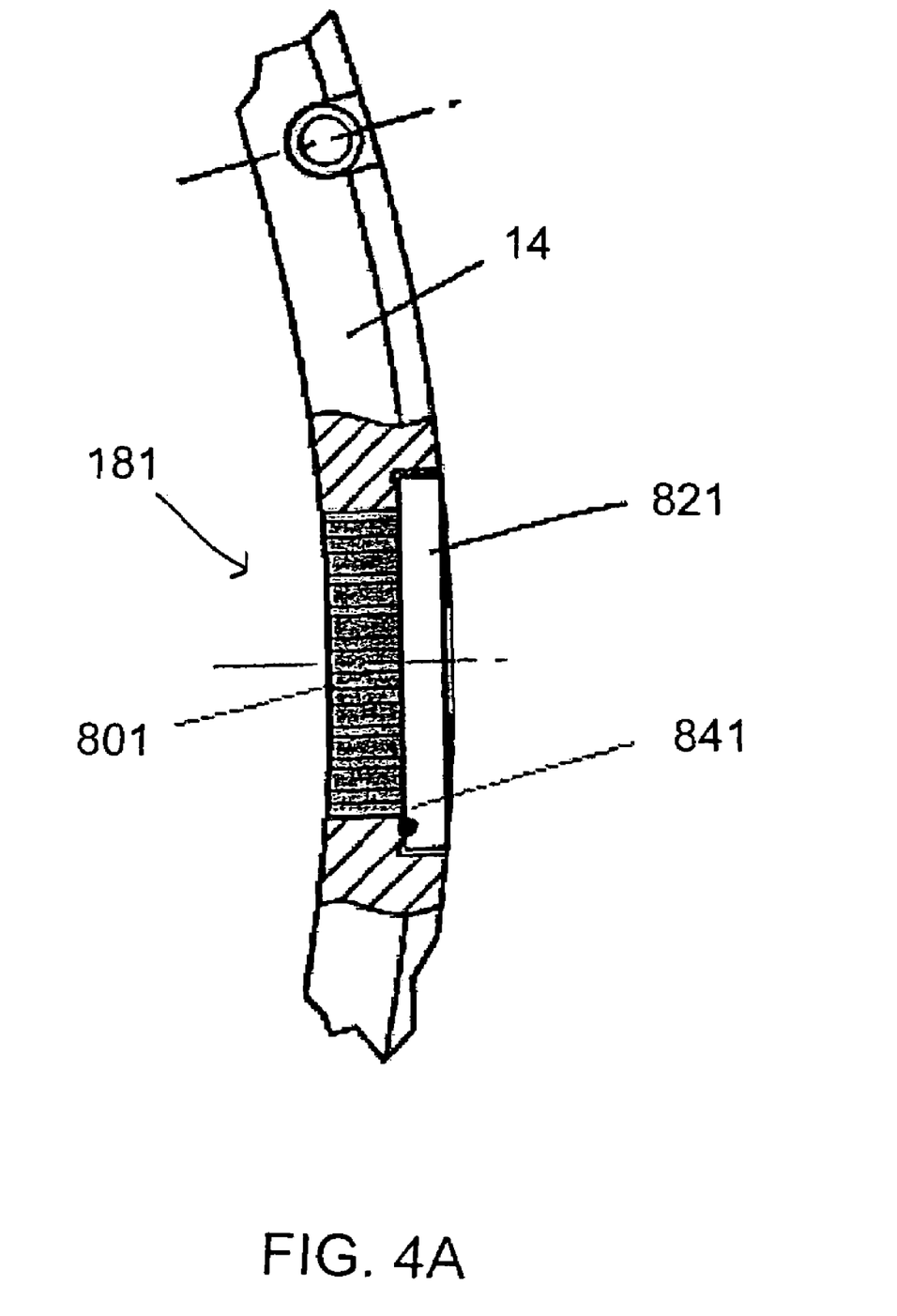
FIG. 4A shows an enlarged cross-sectional view of a chamber liner having an optical window deposition shield according to another embodiment of the present invention.
Figure 4B:
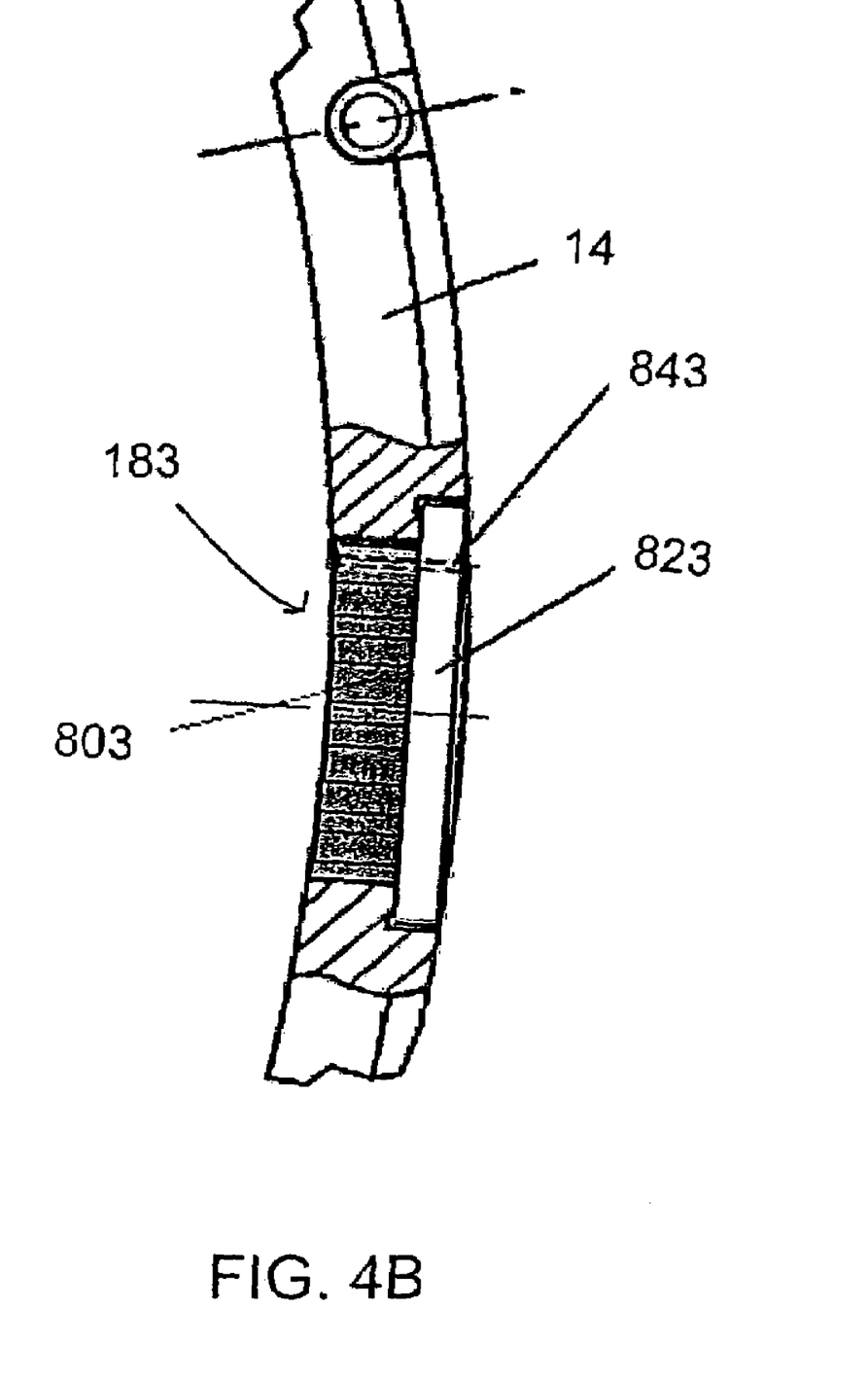
FIG. 4B shows an enlarged cross-sectional view of a chamber liner having an optical window deposition shield according to another embodiment of the present invention.
Figure 4C:
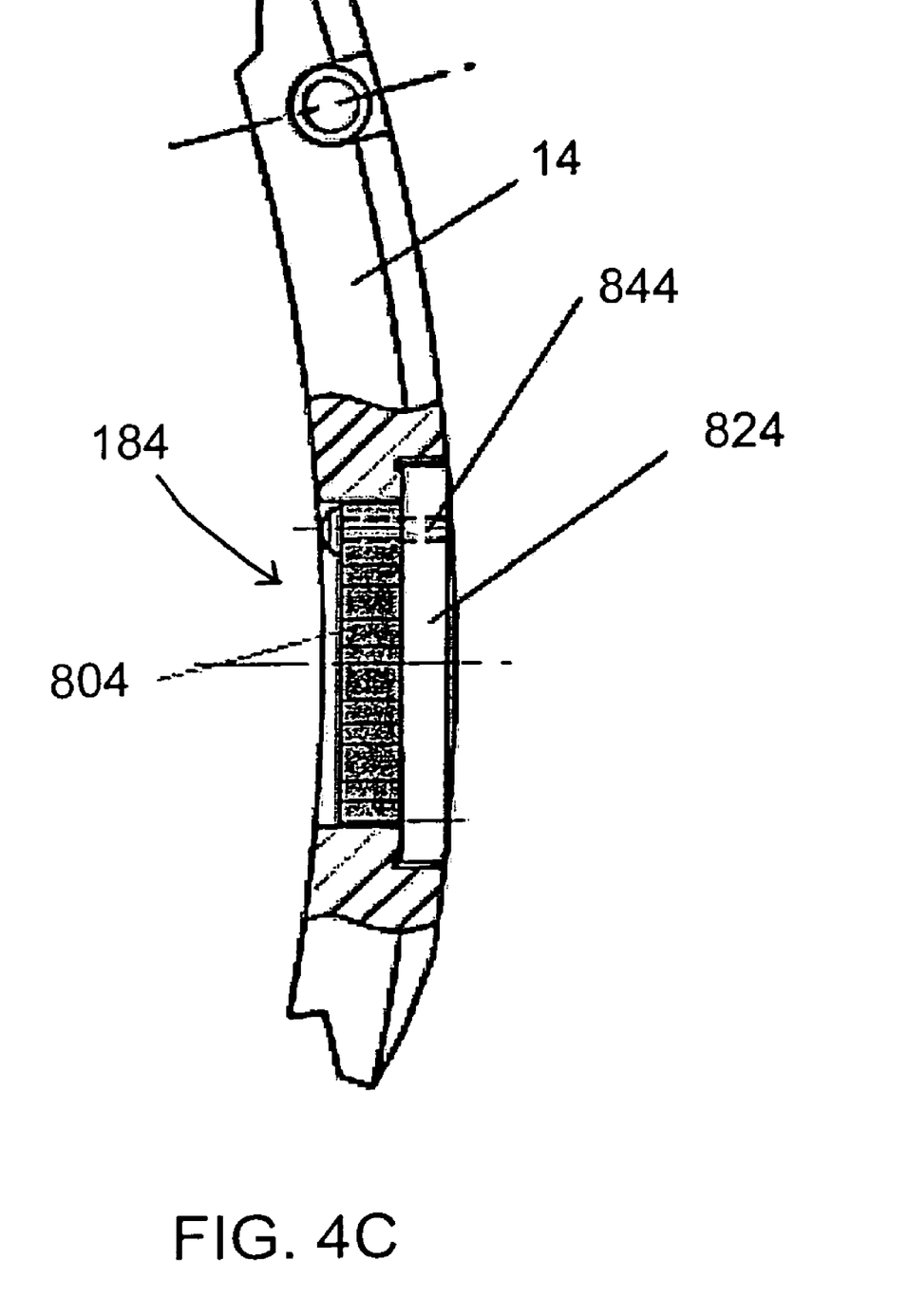
FIG. 4C shows an enlarged cross-sectional view of a chamber liner having an optical window deposition shield according to another embodiment of the present invention.

While the embodiment of FIGS. 3A and 3D show the honeycomb core 80 detachably coupled to the backing plate 82, alternative ways of coupling the honeycomb core 80 to the backing plate 82 may be used. FIGS. 4A–4C show partial cross-sectional views of the chamber liner 14, depicting the coupling of the honeycomb core 80 to the backing plate, according to alternative embodiments of the present invention. FIGS. 4A through 4C emphasize alternative ways of coupling the honeycomb structure to the backing plate and, therefore, full details of the optical window deposition shield are not shown in these figures.

FIG. 4A shows an embodiment of the present invention, wherein the honeycomb core material 801 is connected to the backing plate 821 by way of at least one spot weld 841. The spot welds are located adjacent to the central opening of the backing plate 821. Details of one possible location of the spot welds 841 are shown by the optional weld areas of FIGS. 3A and 3B discussed above. Thus, with the embodiment of FIG. 4A, when replacement of the optical window deposition shield 181 is required, the entire core 801 and sheet metal backing plate assembly 821 must be removed and replaced.

FIG. 4B shows an embodiment of the present invention similar to the embodiment of FIG. 3A in that the honeycomb core is detachably coupled to the backing plate. Specifically, in the embodiment of FIG. 4B, the backing plate 823 includes at least one retaining pin 843 positioned at an edge of the through hole in the backing plate 823. The retaining pin 843 may be connected to the backing plate 823 by way of an interference fit, threads, set screws for any similar mechanism for attaching a pin to the backing plate. To install the honeycomb core 803 to the sheet metal backing plate 823, the core is simply pushed over the pins 843. Each pin 843 will engage a cell of the honeycomb core 803, deforming it slightly as the pin is inserted into the cell. This deformation and the associated friction force retains the core 803 to the sheet metal backing plate 823. The honeycomb core 803 is replaced by simply removing the core from the pins 843 of the backing plate, and placing a new honeycomb core onto the pins 843 of the backing plate 823. Thus, the pins 843 and the backing plate 823 are preferably reusable. As the pins 843 may be exposed to a plasma, these pins are preferably coated with a protective coating such as anodized aluminum, to prolong the life of the pins. Nevertheless, the pin 843 may reach its end of life before the backing plate 823 because the backing plate 823 is substantially protected from exposure to the plasma. Thus, it may be necessary to replace the pins 843 along with the honeycomb core 803. In an alternative embodiment of the optical window deposition shield 183 shown in FIG. 4B, the pins 843 do not substantially deform the cell of the honeycomb core 803.

FIG. 4C shows an optical window deposition shield 184 wherein a honeycomb core 804 is detachably coupled to the sheet metal backing plate 824 by way of threaded fasteners 844. A shaft of the threaded fastener may be connected to the sheet metal backing plate 824 by interference fit, threading, etc. The honeycomb core 804 is installed over the threaded shaft 844 such that the threaded shaft extends through a cell of the honeycomb core 804. A nut then fixes the honeycomb core to the backing plate 824. When the honeycomb core 804 reaches end of life, the nut is removed and the honeycomb core is replaced by removing the used honeycomb core 804 from the threaded shaft and placing a new honeycomb core on the threaded shaft and fixing the new core with the nut. As described with the pin of the embodiment of FIG. 4B, the threaded shaft and nut are exposed to plasma and therefore, are preferably coated with a protective coating. However, the threaded shaft and nut may be replaced periodically without replacement of the sheet metal backing plate 824.

Figure 5:
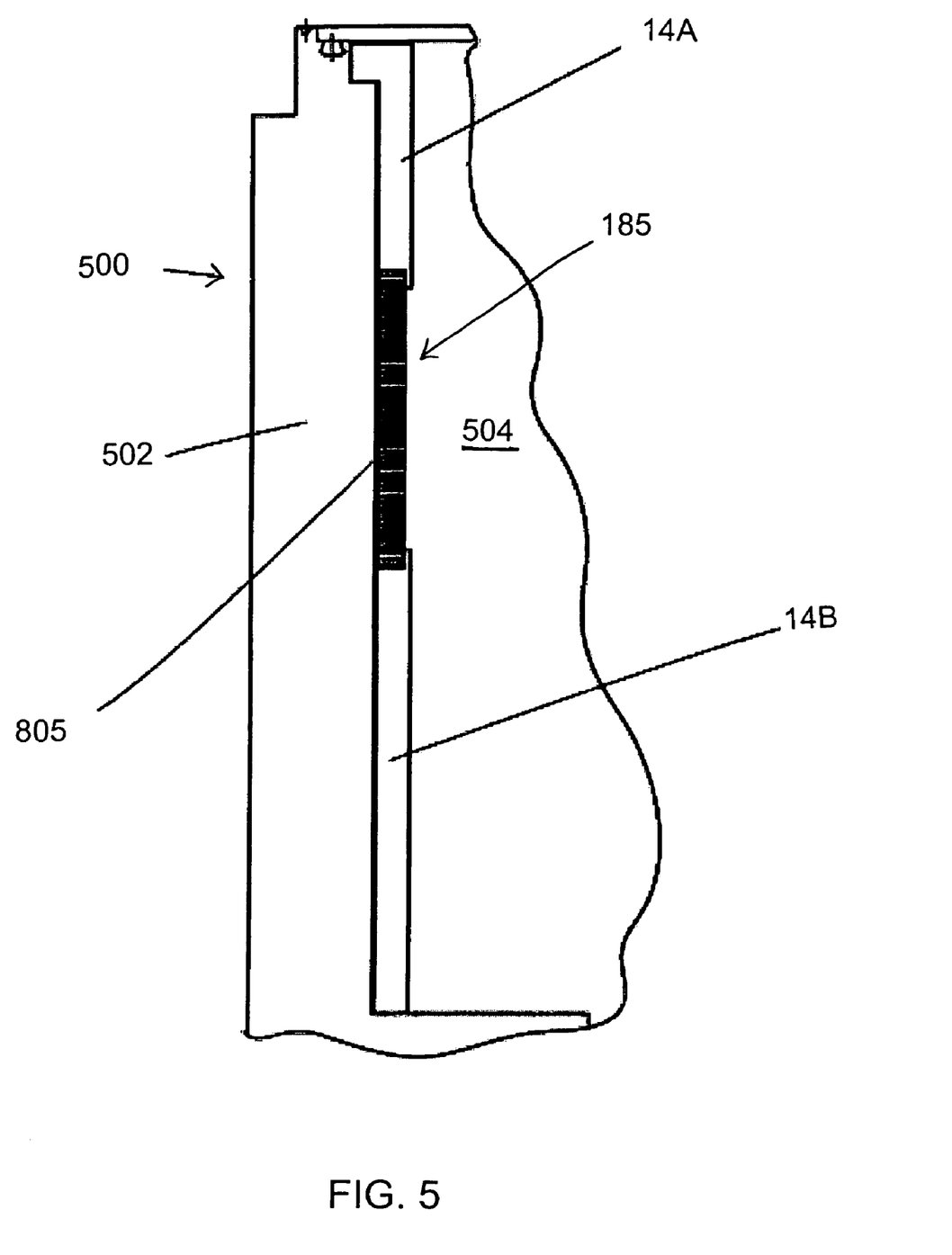
FIG. 5 shows a semiconductor processing chamber having an optical window deposition shield that connects upper and lower chamber liners according to an embodiment of the present invention.

FIG. 5 illustrates a semiconductor processing chamber having an optical window deposition shield that connects upper and lower chamber liners in accordance with an embodiment of the present invention. Specifically, the semiconductor processing chamber 500 includes an exterior wall 502 and an interior portion 504. The exterior wall 502 is protected from the interior 504 by way of an upper chamber liner 14A and a lower chamber liner 14B. One or more optical viewing windows may be placed in the exterior wall 502 between the position of the upper chamber liner 14A and the lower chamber liner 14B. Thus, the optical window deposition shield 185 includes a relatively long piece of substantially planar honeycomb core 185 that is fashioned into an annular ring and held in place in the process chamber 500, between the upper and lower chamber liners 14A and 14B, respectively. The honeycomb ring 185 may be held together with metallic clips (not shown) before installation between the liners 14A and 14B. Moreover, the honeycomb core 185 can be made of aluminum and covered with a protective coating as previously described. In the embodiment of FIG. 5, the honeycomb core 805 can protect one or more optical windows at the same time. As with the previously described embodiments, when maintenance requires changing of the core material 805, the honeycomb core material 805 is simply removed and a new core is inserted in its place. Further, as with other embodiments, the core material can be crushed, bagged, tagged, and safely disposed of.

Any of the above methods may also optionally include machining anodized (or otherwise coated) surfaces that are not exposed surfaces (e.g., to obtain a bare metal connection where the machined surface will mate with another part).

Obviously, numerous modifications and variations of the present invention are possible in light of the above teachings. It is therefore to be understood that within the scope of the appended claims, the invention may be practiced otherwise than as specifically described herein.

The invention claimed is:

1. An optical window deposition shield comprising:
a backing plate having a through hole;
a honeycomb structure comprising plural adjacent corrugated sheets attached together to form a plurality of adjacent cells in spaces between the adjacent corrugated sheets, the cells configured to allow optical viewing through the honeycomb structure, each cell having an aspect ratio of length to diameter sufficient to impede a processing plasma from traveling through the full length of the cell; and
a coupling device configured to couple the honeycomb structure to the backing plate such that the honeycomb structure is aligned with at least a portion of the through hole in the backing plate.

2. The optical window deposition shield of claim 1, wherein said backing plate comprises aluminum sheet metal.

3. The optical window deposition shield of claim 1, wherein said backing plate comprises anodized aluminum sheet metal.

4. The optical window deposition shield of claim 1, wherein said backing plate is configured to be coupled to a chamber liner such that the through hole is at least partially aligned with a hole in the chamber liner.

5. The optical window deposition shield of claim 4, wherein said through hole substantially contours the hole in the chamber liner.

6. The optical window deposition shield of claim 1, wherein said honeycomb structure comprises aluminum.

7. The optical window deposition shield of claim 6, wherein said honeycomb structure is coated with a protective coating.

8. The optical window deposition shield of claim 6, wherein said protective coating comprises a compound including an oxide of aluminum.

9. The optical window deposition shield of claim 6, wherein said protective coating comprises a compound including a mixture of $Al_2O_3$ and $Y_2O_3$.

10. The optical window deposition shield of claim 6, wherein said protective coating comprises a compound including at least one of a III-column element and a lanthanon element.

11. The optical window deposition shield of claim 10, wherein the III-column element comprises at least one of yttrium, scandium, and lanthanum.

12. The optical window deposition shield of claim 10, wherein the lanthanon element comprises at least one of cerium, dysprosium, and europium.

13. The optical window deposition shield of claim 6, wherein said protective coating comprises at least one of yttria ($Y_2O_3$), $Sc_2O_3$, $Sc_2F_3$, $YF_3$, $LA_2O_3$, $CeO_2$, $Eu_2O_3$, and $DyO_3$.

14. The optical window deposition shield of claim 1, wherein said honeycomb structure is configured to fit snugly into a hole in a plasma processing chamber liner to provide a deposition shield within said hole in the chamber liner.

15. The optical window deposition shield of claim 1, wherein said cells of the honeycomb structure have an aspect ratio of about four or more.

16. The optical window deposition shield of claim 1, wherein said coupling device comprises a retaining flange that is detachably coupled to the backing plate by press contact when the backing plate is coupled to the chamber liner.

17. The optical window deposition shield of claim 1, wherein said coupling device comprises at least one retaining pin fixed to the backing plate and configured to engage at least one cell of the honeycomb structure when the honeycomb structure is pressed over the at least one retaining pin.

18. The optical window deposition shield of claim 17, wherein the at least one retaining pin is configured to engage the at least one cell of the honeycomb structure by deforming the cell.

19. The optical window deposition shield of claim 1, wherein said coupling device comprises at least one threaded fastener fixed to the backing plate and configured to hold the honeycomb structure in contact with the backing plate.

20. An optical window deposition shield comprising:
a honeycomb structure planar sheet having a plurality of adjacent cells configured to allow optical viewing through the honeycomb structure, each cell having an aspect ratio of length to diameter sufficient to impede a processing plasma from traveling through the full length of the cell; and
a clip device configured to hold opposing ends of the honeycomb planar sheet together to form a substantially continuous liner of honeycomb material configured to line a chamber wall of a plasma processing chamber.

21. A plasma processing chamber comprising:
a chamber wall having an optical viewing window;
a chamber liner having a liner hole that is substantially aligned with said viewing window to permit viewing an interior of the chamber through the viewing window and liner hole; and
an optical window deposition shield substantially aligned with said viewing window and liner hole, the optical viewing window deposition shield comprising
a backing plate having a through hole,
a honeycomb structure comprising plural adjacent corrugated sheets attached together to form a plurality of adjacent cells in spaces between the adjacent corrugated sheets, the cells configured to allow optical viewing through the honeycomb structure, each cell having an aspect ratio of length to diameter sufficient to impede a processing plasma from traveling through the full length of the cell, and
a coupling device configured to couple the honeycomb structure to the backing plate such that the honeycomb structure is aligned with at least a portion of the through hole in the backing plate.

22. The plasma processing chamber of claim 21, wherein said backing plate comprises aluminum sheet metal.

23. The plasma processing chamber of claim 21, wherein said backing plate comprises anodized aluminum sheet metal.

24. The plasma processing chamber of claim 21, wherein said backing plate is configured to be coupled to a chamber liner such that the through hole is at least partially aligned with a hole in the chamber liner.

25. The plasma processing chamber of claim 24, wherein said through hole substantially contours the hole in the chamber liner.

26. The plasma processing chamber of claim 21, wherein said honeycomb structure comprises aluminum.

27. The plasma processing chamber of claim 26, wherein said honeycomb structure is coated with a protective coating.

28. The plasma processing chamber of claim 26, wherein said protective coating comprises a compound including an oxide of aluminum.

29. The plasma processing chamber of claim 26, wherein said protective coating comprises a compound including a mixture of $Al_2O_3$ and $Y_2O_3$.

30. The plasma processing chamber of claim 26, wherein said protective coating comprises a compound including at least one of a III-column element and a lanthanon element.

31. The plasma processing chamber of claim 30, wherein the III-column element comprises at least one of yttrium, scandium, and lanthanum.

32. The plasma processing chamber of claim 30, wherein the lanthanon element comprises at least one of cerium, dysprosium, and europium.

33. The plasma processing chamber of claim 26, wherein said protective coating comprises at least one of yttria ($Y_2O_3$), $Sc_2O_3$, $Sc_2F_3$, $YF_3$, $LA_2O_3$, $CeO_2$, $Eu_2O_3$, and $DyO_3$.

34. The plasma processing chamber of claim 21, wherein said honeycomb structure is configured to fit snugly into a hole in a plasma processing chamber liner to provide a deposition shield within said hole in the chamber liner.

35. The plasma processing chamber of claim 21, wherein said cells of the honeycomb structure have an aspect ratio of about four or more.

36. The plasma processing chamber of claim 21, wherein said coupling device comprises a retaining flange that is detachably coupled to the backing plate by press contact when the backing plate is coupled to the chamber liner.

37. The plasma processing chamber of claim 21, wherein said coupling device comprises at least one retaining pin fixed to the backing plate and configured to engage at least one cell of the honeycomb structure when the honeycomb structure is pressed over the at least one retaining pin.

38. The plasma processing chamber of claim 37, wherein the at least one retaining pin is configured to engage the at least one cell of the honeycomb structure by deforming the cell.

39. The plasma processing chamber of claim 21, wherein said coupling device comprises at least one threaded fastener fixed to the backing plate and configured to hold the honeycomb structure in contact with the backing plate.

40. An optical window deposition shield comprising:
means for impeding processing plasma from traveling into contact with a viewing window of a plasma chamber and for allowing viewing through cells formed between attached adjacent corrugated sheets; and
means for holding the means for impeding within an opening of a chamber liner used in the plasma chamber.

41. A method for impeding a processing plasma from traveling into contact with a viewing window of a plasma chamber, the method comprising;
providing a mounting hole in a liner of the plasma chamber; and
fixedly mounting a honeycomb structure within the mounting hole, said honeycomb structure comprising plural adjacent corrugated sheets attached together to form a plurality of adjacent cells in spaces between the adjacent corrugated sheets, the cells configured to allow optical viewing through the honeycomb structure, each cell having an aspect ratio of length to diameter sufficient to impede a processing plasma from traveling through the full length of the cell.

42. An optical window deposition shield comprising:
a backing plate having a through hole;
a honeycomb structure comprising a plurality of adjacent cells configured to allow optical viewing through the honeycomb structure, each cell having an aspect ratio of length to diameter sufficient to impede a processing plasma from traveling through the full length of the cell; and a coupling device configured to couple the honeycomb structure to the backing plate such that the honeycomb structure is aligned with at least a portion of the through hole in the backing plate and comprising a retaining flange that is detachably coupled to the backing plate by press contact when the backing plate is coupled to a chamber liner.

43. An optical window deposition shield comprising:

a backing plate having a through hole;

a honeycomb structure comprising a plurality of adjacent cells configured to allow optical viewing through the honeycomb structure, each cell having an aspect ratio of length to diameter sufficient to impede a processing plasma from traveling through the full length of the cell; and a coupling device configured to couple the honeycomb structure to the backing plate such that the honeycomb structure is aligned with at least a portion of the through hole in the backing plate and comprising at least one retaining pin fixed to the backing plate and configured to engage at least one cell of the honeycomb structure when the honeycomb structure is pressed over the at least one retaining pin.

44. The optical window deposition shield of claim 43, wherein the at least one retaining pin is configured to engage the at least one cell of the honeycomb structure by deforming the cell.

45. A plasma processing chamber comprising:

a chamber wall having an optical viewing window;

a chamber liner having a liner hole that is substantially aligned with said viewing window to permit viewing an interior of the chamber through the viewing window and liner hole; and an optical window deposition shield substantially aligned with said viewing window and liner hole, the optical viewing window deposition shield comprising a backing plate having a through hole, a honeycomb structure comprising a plurality of adjacent cells configured to allow optical viewing through the honeycomb structure, each cell having an aspect ratio of length to diameter sufficient to impede a processing plasma from traveling through the full length of the cell, and a coupling device configured to couple the honeycomb structure to the backing plate such that the honeycomb structure is aligned with at least a portion of the through hole in the backing plate and comprising a retaining flange that is detachably coupled to the backing plate by press contact when the backing plate is coupled to the chamber liner.

46. A plasma processing chamber comprising:

a chamber wall having an optical viewing window;

a chamber liner having a liner hole that is substantially aligned with said viewing window to permit viewing an interior of the chamber through the viewing window and liner hole; and an optical window deposition shield substantially aligned with said viewing window and liner hole, the optical viewing window deposition shield comprising a backing plate having a through hole, a honeycomb structure comprising a plurality of adjacent cells configured to allow optical viewing through the honeycomb structure, each cell having an aspect ratio of length to diameter sufficient to impede a processing plasma from traveling through the full length of the cell, and a coupling device configured to couple the honeycomb structure to the backing plate such that the honeycomb structure is aligned with at least a portion of the through hole in the backing plate and comprising at least one retaining pin fixed to the backing plate and configured to engage at least one cell of the honeycomb structure when the honeycomb structure is pressed over the at least one retaining pin.

47. The plasma processing chamber of claim 46, wherein the at least one retaining pin is configured to engage the at least one cell of the honeycomb structure by deforming the cell.

* * * * *